United States Patent
Nadeau-Dostie et al.

(10) Patent No.: US 7,617,425 B2
(45) Date of Patent: Nov. 10, 2009

(54) METHOD FOR AT-SPEED TESTING OF MEMORY INTERFACE USING SCAN

(75) Inventors: Benoit Nadeau-Dostie, Gatineau (CA); Jean-François Côté, Chelsea (CA)

(73) Assignee: LogicVision, Inc., San Jose, CA (US)

( * ) Notice: Subject to any disclaimer, the term of this patent is extended or adjusted under 35 U.S.C. 154(b) by 188 days.

(21) Appl. No.: 11/439,497

(22) Filed: May 24, 2006

(65) Prior Publication Data

US 2007/0266278 A1    Nov. 15, 2007

Related U.S. Application Data

(60) Provisional application No. 60/693,778, filed on Jun. 27, 2005.

(51) Int. Cl.
*G11C 29/00* (2006.01)

(52) U.S. Cl. ............................. 714/719; 714/5; 714/25; 714/30; 714/718; 714/723; 714/720; 714/726; 714/727; 714/729; 714/730; 714/732; 714/733; 714/734; 714/736; 714/742; 714/743; 365/201

(58) Field of Classification Search .................. None
See application file for complete search history.

(56) References Cited

U.S. PATENT DOCUMENTS

| | | | |
|---|---|---|---|
| 6,715,117 B2 * | 3/2004 | Mangyo et al. | 714/719 |
| 6,876,591 B2 * | 4/2005 | Gappisch et al. | 365/201 |
| 7,222,272 B2 * | 5/2007 | Takazawa et al. | 714/718 |
| 7,287,202 B1 * | 10/2007 | Simeral et al. | 714/718 |
| 7,370,249 B2 * | 5/2008 | Bao et al. | 714/718 |
| 2006/0218452 A1 * | 9/2006 | Njinda et al. | 714/718 |

\* cited by examiner

*Primary Examiner*—John P Trimmings
(74) *Attorney, Agent, or Firm*—Ridout & Maybee LLP

(57) ABSTRACT

A method and a circuit of testing of a memory interface associated with an embedded memory in a semiconductor circuit involves writing to two memory locations in succession; reading the two memory locations in succession in the same order in which the two memory locations were written; capturing output data from the memory interface; and analyzing captured output data to determine whether said captured output data corresponds to expected data.

27 Claims, 9 Drawing Sheets

METHOD FOR AT-SPEED TESTING OF MEMORY INTERFACE USING SCAN

CROSS-REFERENCE TO RELATED APPLICATIONS

This application claims the benefit of U.S. Provisional Patent Application Ser. No. 60/693,778 filed Jun. 27, 2005.

BACKGROUND OF THE INVENTION

1. Field of the Invention

The present invention relates, in general, to the testing of integrated circuits and, more specifically, to verification of the exact timing of a memory interface with surrounding logic when performing an at-speed scan test of an integrated circuit (IC).

2. Description of Related Art

The main challenges which face semiconductor manufacturers and integrated circuit designers revolve around achieving the highest yield in the shortest amount of time. This is especially true as the industry continues to move to smaller process geometries and beyond and as circuit operating speeds continue to increase. There is a need therefore for products and test solutions that enable circuit designers to improve product quality, gain information on the source of product failures and field returns, and use that information to create higher yielding integrated circuits (ICs) faster. To that end, it is well known to test ICs by scan test techniques in which test data is scanned into an IC to stimulate the IC and IC response data is scanned out for analysis. One problem which has yet to be satisfactorily resolved is testing of memory test interfaces and surrounding test logic which generate memory inputs and receive memory outputs.

FIGS. 1a and 1b illustrate a memory 12, surrounded by input and output logic circuitry 14, and 16, respectively. The memory includes memory cells, address decoder, precharge logic, etc., which are not shown for simplicity. Input scannable memory elements 18, which form a test input scan chain, are provided for scanning test data into the circuit and output scannable memory elements 20, which form a test response output scan chain, are provided for capturing and scanning test responses from the circuit. The input memory elements apply test patterns to the logic which, in turn, apply inputs to the write enable control, address and data inputs of the memory 12. The data outputs of the memory are applied to the output logic on the output side of the memory. The output of the logic is applied to the output scannable memory elements 20. The memory elements are arranged into scan chains by applying an active scan enable signal, SE, to respective inputs. An inactive scan enable signal is applied to the memory elements to launch test data or capture response data. As is well known in the art, the scannable memory elements include flip-flops for storing test and response data.

The bold lines in the figures represent a plurality of lines or connectors and corresponding scannable memory elements, the number of which depends on the number of memory write enable inputs, address inputs and data inputs and memory outputs of the circuit design.

For the purpose of simplifying the description, it is assumed herein that all flip-flops, and the memory are positive edge-triggered. In FIG. 1a, the memory is in phase with the surrounding logic so that it captures its input and updates its output on the rising edge of the clock. In FIG. 1b, the memory is out of phase with the surrounding logic because of clock inversion caused by inverter 22. The memory output is latched by transparent latch 24 so that the memory output appears to update its output on the positive edge before it is used by the surrounding logic 16. The memory input is captured on the falling edge of the clock. The test method of the present invention addresses both circuit configurations.

FIG. 2 illustrates a known memory circuit 12 which includes a memory test interface or BIST collar 32 which surrounds memory 12, a memory BIST (Built-In Self-Test) circuit 34 and circuit modifications, described below, to the memory circuits of FIGS. 1a and 1b for performing at-speed scan testing of the memory interface 32. The circuit logic includes logic 14a which outputs a write enable data, logic 14b which outputs an address and input data to be applied to the memory and output logic 16 which receives data output by the memory. The test interface is indicated by the dotted line and includes test interface input multiplexers (muxes) 36, controlled by a BistOn select signal for selecting between functional inputs and BIST inputs. The input muxes include a write enable mux 38, a plurality of address input muxes 40 and a plurality of data input muxes 42.

A bypass mechanism 44 connects data inputs and corresponding data outputs through respective scannable flip-flops 46. Flip-flops 46 are clocked on the same edge of the clock, CK, which clocks the memory. The test interface also includes an output muxes 48, controlled by a test mode signal, tm, which is active high during scan and BIST testing to select between a memory output and the output of a corresponding bypass flip-flops 46.

Scannable observation logic 50 and 52 are provided for the control (e.g. write enable) and address inputs, respectively, of the memory. This logic is in the form of scannable flip-flops that are clocked on the same edge as the memory. The bypass mechanism and the observation logic complement other features, such as memory BIST circuit 34, to test the memory independently of a scan test.

A scan test is performed by deselecting the memory, setting BistOn low and tm high. Test data is scanned into the input scan chain 18 and applied to input logic 14a and 14b whose outputs are applied to the test interface input muxes 36. The outputs of input muxes 38 and 40 are captured in observation logic 50 and 52 and the outputs of data input muxes 42 are captured in bypass flip-flops 46. The outputs of bypass flip-flops 42 are applied to inputs of output muxes 48, the outputs of which are applied to output logic 16 whose outputs are captured by the output scan chain. The captured data is scanned out for analysis.

An interface input timing test is performed by launching test data from the input scan chain and capturing data in the observation memory elements 50 and 52 and bypass flip-flops 46. The captured data is scanned out for analysis. An output timing test involves launching data from bypass flip-flops 46 and capturing the resulting data in output scan chain 20. The captured data is scanned out and analyzed. As explained below, there are drawbacks to this method and circuitry.

The observation and bypass mechanisms allow for testing the timing of the input relatively accurately because the setup time for a synchronous configuration is similar to that of a flip-flop. However, the test of the output side of the memory is less accurate because the bypass flip-flops update their output significantly faster than the memory. As a result, subtle delay faults can escape detection by a combination of a scan test and a memory BIST test even though both tests are performed at-speed. Another limitation is that the bypass mechanism can be relatively expensive in terms of silicon area for wide data buses. Further, because of their potential impact on timing, it would also be desirable to eliminate the set of output muxes 48 at the output of the memory. It will be seen therefore that there is a need for a method and circuitry that address these limitations.

SUMMARY OF THE INVENTION

The present invention provides a method and test interface circuitry that enables the transfer of test data through the memory using functional clocks so that the exact timing of the interface with surrounding logic is tested whenever possible. The method is compatible with both random logic BIST and ATPG scan test methods. Different embodiments of the method provide different trade-offs of hardware versus software support. The method supports various types of multi-port memories. For a given port type, slight variations of the method are proposed to handle different clock configurations. The embodiments also allow gated clock configurations to reduce power during certain modes of operation (functional or memory BIST) and reduce the number of simulation events during verification of these modes.

In accordance with the method of the present invention, an initialization data word and a final data word are propagated through the memory to act as a pipeline from the memory data input terminal to the memory data output terminal. The method writes to and reads from two memory locations in fast succession to cause the memory circuitry (memory cells, address decoder (partial), precharge logic, etc.) and surrounding logic to be tested at speed.

The method of the present invention is generally defined as a method of testing a memory interface associated with an embedded memory in a semiconductor circuit, said method comprising writing to two memory locations in succession; reading the two memory locations in succession in the same order in which the two memory locations were written; capturing output data from the memory interface; and analyzing captured output data to determine whether the captured output data corresponds to expected data.

According to a first broad aspect of the present disclosure, there is provided a method of testing a memory interface associated with an embedded memory in a semiconductor circuit, said method comprising: launching an initialization address and initialization data; writing said initialization data to a memory location corresponding to said initialization address and launching final data; writing said final data to a memory location corresponding to a final address derived from said initialization address; reading initialization data from said memory location corresponding to said initialization address; reading final said data from said memory location corresponding to said final address; capturing output data from said memory interface corresponding to the act of reading from the memory location corresponding to said final address; and analyzing said captured output data to determine whether said captured output data corresponds to data.

According to a second broad aspect of the present disclosure, there is provided a method for performing an at-speed scan test of a memory interface associated with an embedded memory in a semiconductor circuit, said memory having memory data inputs controllable from and memory data outputs observable by scannable memory elements, said method comprising: scanning an initialization address and an initialization data word into respective scannable memory elements in a fan-in of respective memory address and of the memory data inputs of the memory; launching said initialization address and initialization data word from said scannable memory elements in the fan-in of the memory address and memory data inputs; writing said initialization data word to said initialization address and launching a final data word; deriving a final address from said initialization address; writing said final data word to said final address; reading said initialization address; reading said final address; and capturing said memory data outputs in output scan chains.

According to a third broad aspect of the present disclosure, there is provided a method for performing an at-speed scan test of a memory interface associated with an embedded memory in a semiconductor circuit said memory having memory data inputs controllable from and memory data outputs observable by scannable memory elements, said method comprising: storing a test address in a register consisting of at least one storage element and applying an output of said register to an input of a corresponding test interface address input selector; alternating an output of said at least one storage element to produce initialization and final addresses; scanning said initialization address and an initialization data word into respective scannable memory elements in a fan-in of respective memory address and of the memory data inputs of the memory; launching said initialization address and initialization data word from said scannable memory elements in the fan-in of the memory address and memory data inputs; writing said initialization data word to said initialization address and launching a final data word; writing said final data word to said final address; reading said initialization address; reading said final address; and capturing said memory data outputs in output scan chains.

According to a fourth broad aspect of the present disclosure, there is provided a semiconductor circuit having an embedded memory having a write enable input, memory address inputs, memory data inputs and memory data outputs, and interface logic to be tested, said circuit comprising: an address register in a fan-in to said memory address inputs for receiving and holding initialization address data corresponding to a first of said memory locations for a first predetermined number of clock cycles prior to a capture cycle; means for deriving, from said initialization address data, final memory address data corresponding to a second of said memory locations; and a data register for storing an initialization data input for a second predetermined number of clock cycles prior to a capture cycle; means for writing to said initialization address and said final address in succession and for reading said initialization address and said final address in succession in the same order in which said initialization address and said final address were written under control of a clock signal; and means for capturing output data in the fan-out of said memory data outputs.

BRIEF DESCRIPTION OF THE DRAWINGS

These and other features of the invention will become more apparent from the following description in which reference is made to the appended drawings in which.

DETAILED DESCRIPTION OF EMBODIMENTS

In the following detailed description, numerous specific details are set forth in order to provide a thorough understanding of the present invention. However, it will be understood by those skilled in the art that the present invention may be practiced without these specific details. In other instances, well known methods, procedures, components and circuits have not been described in detail so as not to obscure aspects of the present invention.

In accordance with the method of the present invention, an initialization data word and a final data word are propagated through the memory to act as a pipeline from memory data input terminals to memory data output terminals. The method writes to and reads from two memory locations in fast succession to cause the memory circuitry (memory cells, address decoder (partial), precharge logic, etc.) and surrounding logic to be tested at speed.

Figure 3:
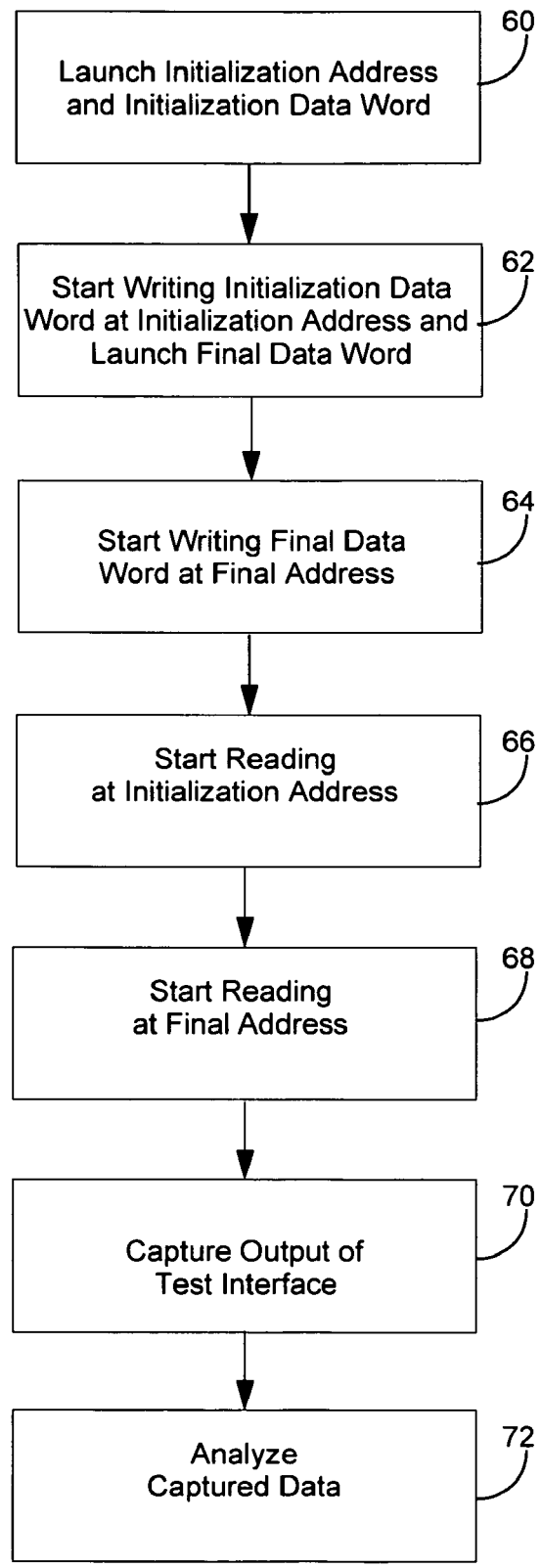
FIG. 3 is a flow diagram illustrating the operations performed according to the present invention.

The sequence of events for a number of embodiments of the method of the present invention is described below. In a preferred embodiment of the present invention, the sequence of events is performed during a burst of five clock cycles, during which the operations in the flow diagram of FIG. 3 are performed:

First, an initialization address and data word are launched (step 60);

Second, the initialization data word is written to the initialization address and a final data word is launched (step 62);

Third, the final data word is written to a second or final address (step 64); Preferably, the final address is derived from the initialization address and obtained by flipping at least one bit of the initialization address;

Fourth, the initialization data word is read from the initialization address (step 66);

Fifth, the final data word is read from the final address (step 68);

Sixth, the outputs of surrounding logic is captured (step 70); and

Seventh, the captured data is analyzed to determine whether it corresponds to expected data (step 72).

Figure 4:
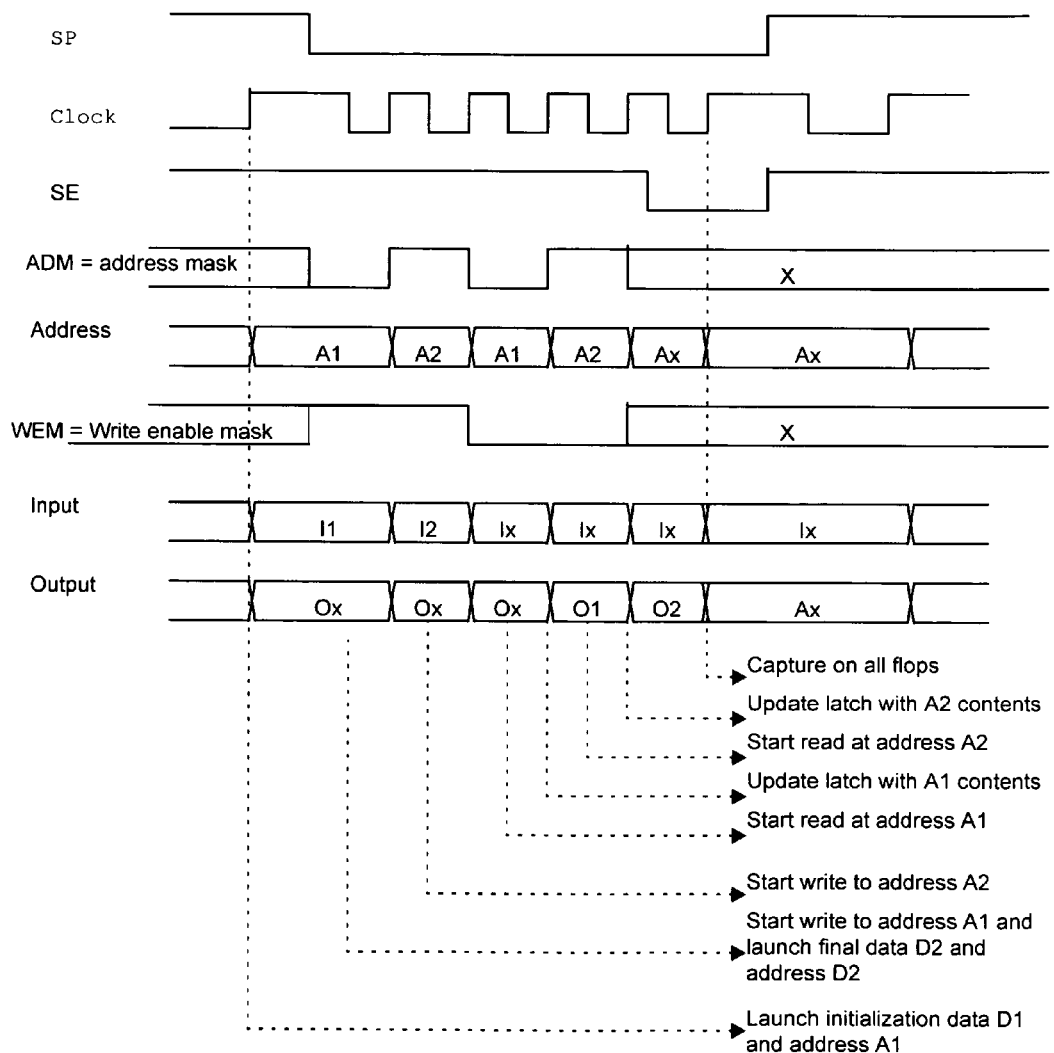
FIG. 4 is a timing diagram illustrating signal waveforms according to an embodiment in which memory is out-of-phase with surrounding logic.
Figure 5:
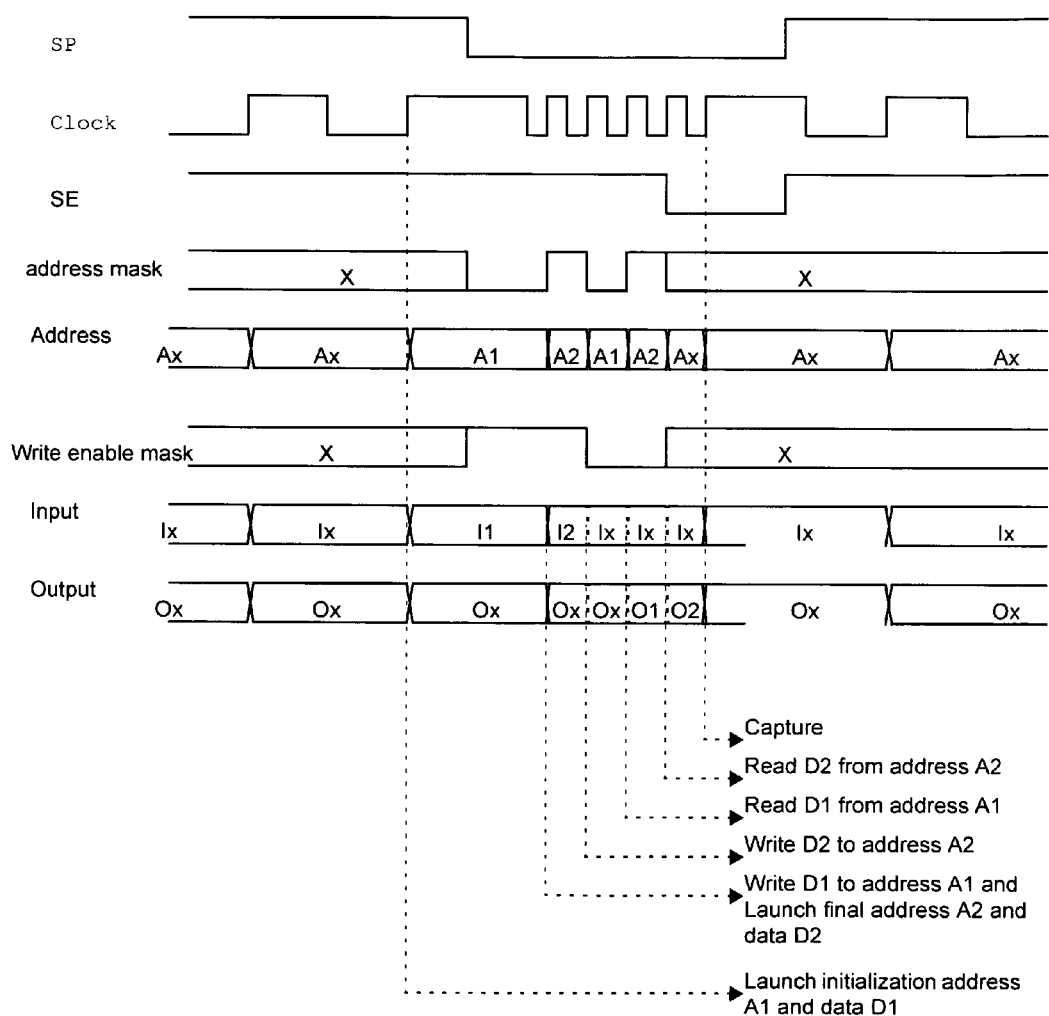
FIG. 5 is a timing diagram illustrating signal waveforms according to an embodiment in which memory is in-phase with surrounding logic.

This sequence of operations is generally referred to a "write-thru" process herein. The waveforms associated with the sequence of operations is illustrated in FIG. 4 and FIG. 5. FIG. 4 shows waveforms for a memory which is out-of-phase with surrounding logic (time borrowing) while FIG. 5 shows waveforms for a memory which is in-phase with surrounding logic. The timing shown in the various figures is for a scan test method such as that described and claimed in Applicants' U.S. application Ser. No. 10/739,055 filed Dec. 19, 2003. The scan test method described therein is for testing a circuit having memory elements arranged into one or more scan chains. The method has a shift phase for serially loading test patterns into the said chains and serially unloading test response patterns from the scan chains and a capture phase for capturing the response of the circuit to the test pattern. During the capture phase, the serial output of each scan chain is connected to its respective serial input, and a predetermined number of clock cycles are applied with the memory elements being configured in a non-capture mode for all but the last clock cycle of the capture phase and being configured in capture mode for the last clock cycle of the capture phase. In the present invention, at the very least, the last two clock cycles must be applied at the rated or system speed to perform the last read access and capture of the result of the read operation in the flip-flops. However, it will be understood by those skilled in the art that other scan test methods can be used.

In FIG. 4 and FIG. 5, the waveform labeled SP is a test phase control signal which defines a shift phase (high) and a capture phase (low). The waveform labeled Clock is the clock signal, (CK in FIG. 3) applied to the circuit and memory. The waveform labeled SE is a scan enabled signal which configures scannable memory in a shift mode (high) or a capture mode (low). Scannable memory elements are configured in shift mode when test data is shifted into scan chains and when test response data is shift out of the scan chains. The waveform labeled Adm is an address mask control signal which controls the address applied to address inputs of the memory. The waveform labeled Address is the address signal applied to the address inputs of the memory. As can be seen, the figures shows two address: A1 and A2. The waveform labeled WEM is a write enable mask signal which controls the write enable signal applied to the memory. WEM is first maintained high to write to the two memory locations in succession and then changed to low to read from the two memory locations in succession in the same order in which the addresses were written to the memory locations. The waveforms labeled Input and Output are the input and output signals at inputs and outputs, respectively, of the memory.

The above described sequence of operations yields a repeatable timing test that allows the calculation of transition fault coverage of the circuit in a conventional manner for a scan testable circuit. By writing to and reading from two memory locations in fast succession, the memory circuitry (memory cells, address decoder (partial), precharge logic, etc.) as well as the surrounding logic will be tested at speed. A single write/read operation would not yield a proper transition of the memory output for a memory that updates its output on a write operation and would thereby invalidate an at-speed test.

In the following description, the following assumptions are made. Memories are synchronous memories operating either in-phase or out-of-phase with surrounding logic. The specific embodiments illustrated, show out-of-phase configurations. For out-of-phase configurations, memory access starts on the falling edge of the clock and an update latch is used to stretch the access cycle (time borrowing). The method described in aforementioned application Ser. No. 10/739,055 is preferred because it allows for the use of longer burst lengths to achieve higher at-speed coverage of the memory input. However, it will be understood that other scan methods with shorter burst lengths (down to two) can be used. Memories are single port and their address range can be incomplete as discussed later in a discussion of handling of incomplete address space and multi-port memories.

The method provides a number of advantages. First, it tests the exact timing of memory output timing, i.e., from the start of the read operation to data capture. Second, it provides for high coverage: many address and data inputs are applied at-speed through the memory. Third, the method handles memories that either update or do not update their outputs during a write operation.

Figure 7:
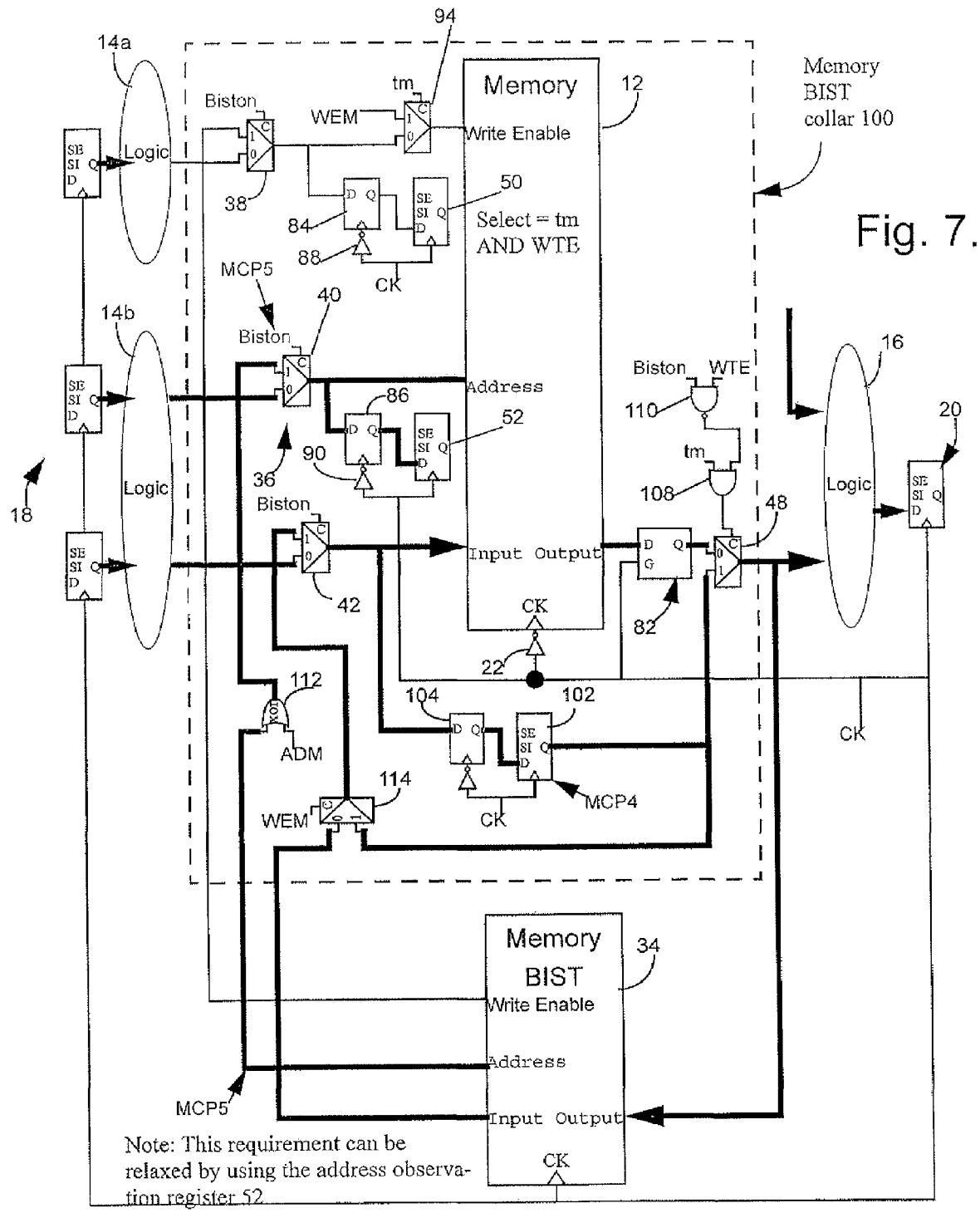
FIG. 7 is circuit diagram of a test interface according to second embodiment of the present invention.
Figure 8:
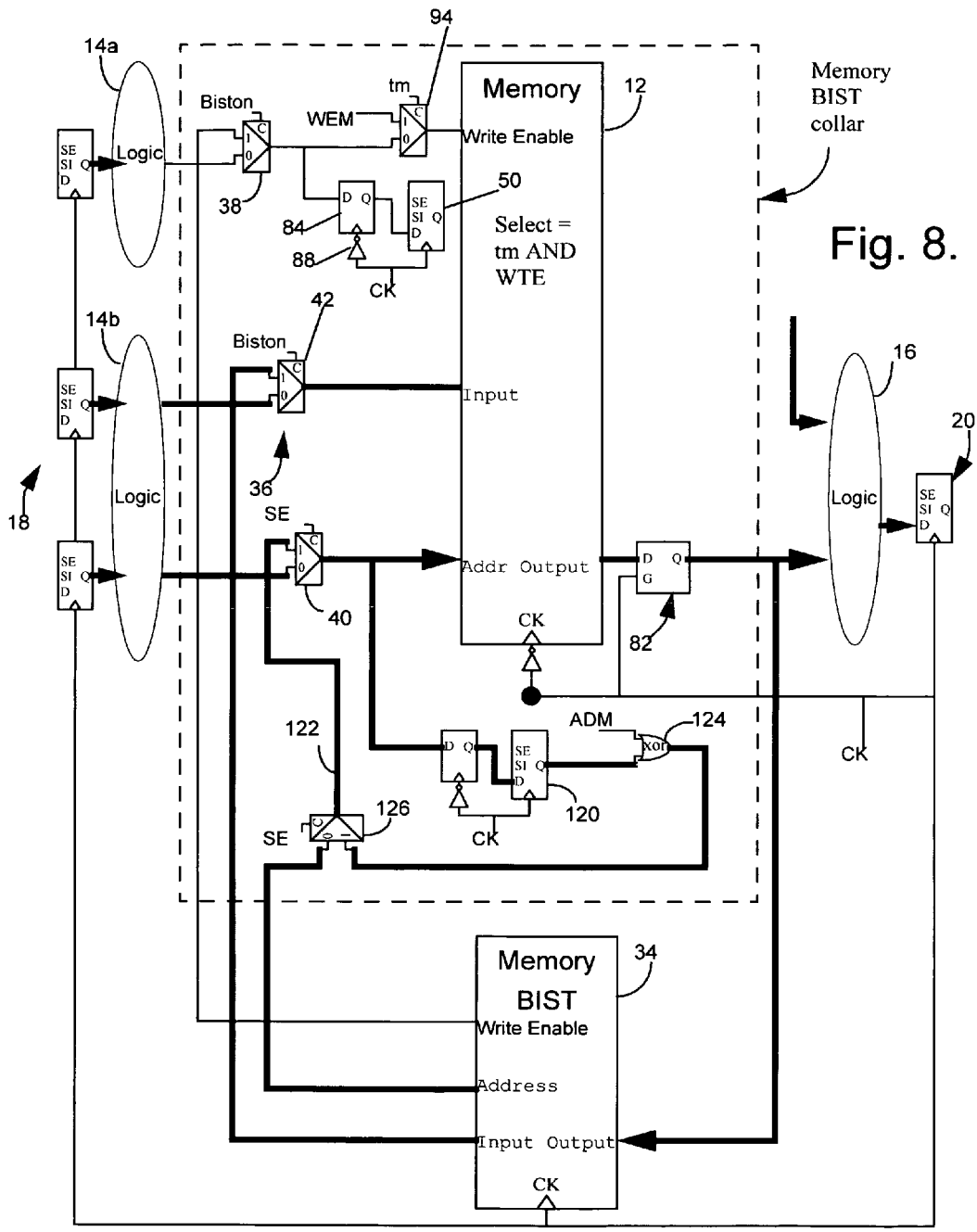
FIG. 8 is circuit diagram of a test interface according to a third embodiment of the present invention.

The present invention provides different test interface embodiments for carrying out the test interface timing method in order to address the following specific situations: a first situation in which changes to functional circuits are permitted (FIG. 6); a second situation in which no changes to functional circuits are permitted (FIG. 7); and a third situation in which no functional circuit modification and no memory bypass are permitted (FIG. 8).

Functional Circuit Modifications Permitted

Figure 6:
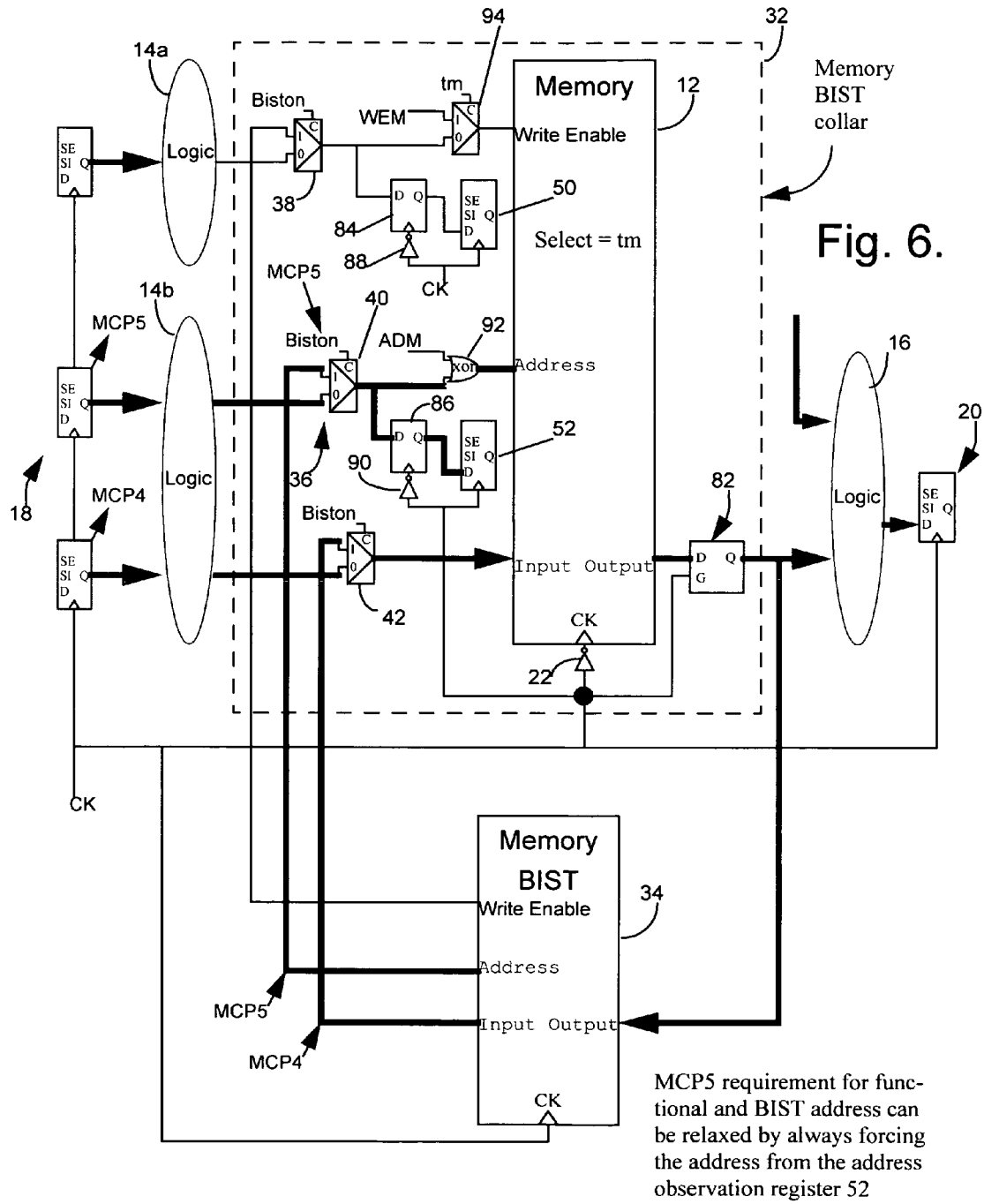
FIG. 6 is circuit diagram of a test interface according to a first embodiment of the present invention.

FIG. 6 illustrates a first embodiment of a memory test interface for use in a circuit 80 in which functional circuit modifications are permitted. The figure shows a circuit with an out-of-phase circuit configuration which includes an inverter 22 applied to the memory clock input and a transparent latch 82 for each memory output. The output of the transparent latches are applied to the output logic 16 and to inputs labeled "output" of memory BIST circuit 34. As in FIG. 2, each of the outputs of output logic 16 is applied to the data input of a corresponding scannable memory elements 20 of the output scan chain.

Retiming memory elements 84 and 86 are connected to the outputs of the test interface input muxes 38 and 40 associated with the write enable input and address inputs, respectively, of the memory and observation logic 50 and 52 is provided for the write enable and address inputs of the memory. The clock inputs of latches 84 and 86 are inverted by inverters 88 and 90. Retiming memory elements 84 and 86 as well as inverters 88 and 90 are not needed when the memory is in-phase.

Figure 1A:
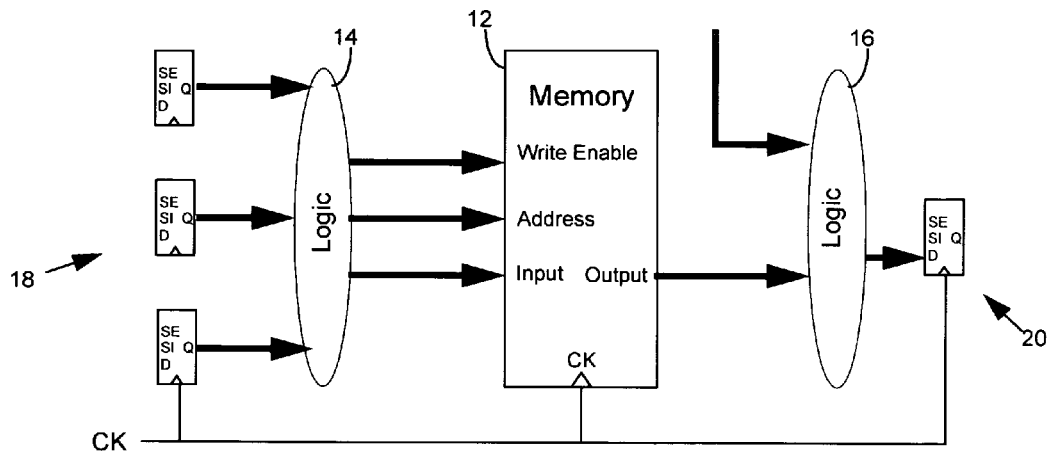
FIG. 1a illustrates a memory circuit which is in-phase with surrounding logic so that it captures its input and updates its output on the rising edge of the clock.
Figure 1B:
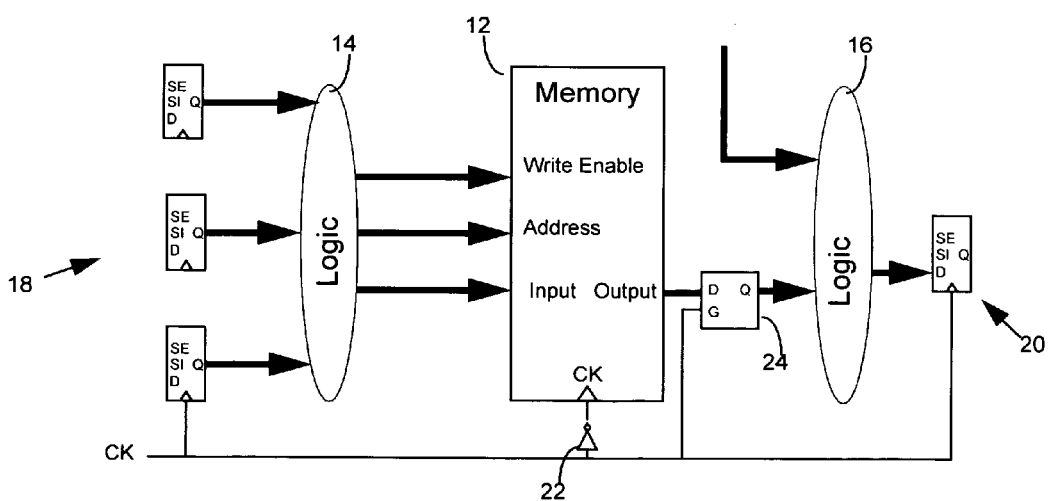
FIG. 1b illustrates a memory circuit in which is out-of-phase with surrounding logic so that it captures its input and updates its output on the falling edge of the clock.
Figure 2:
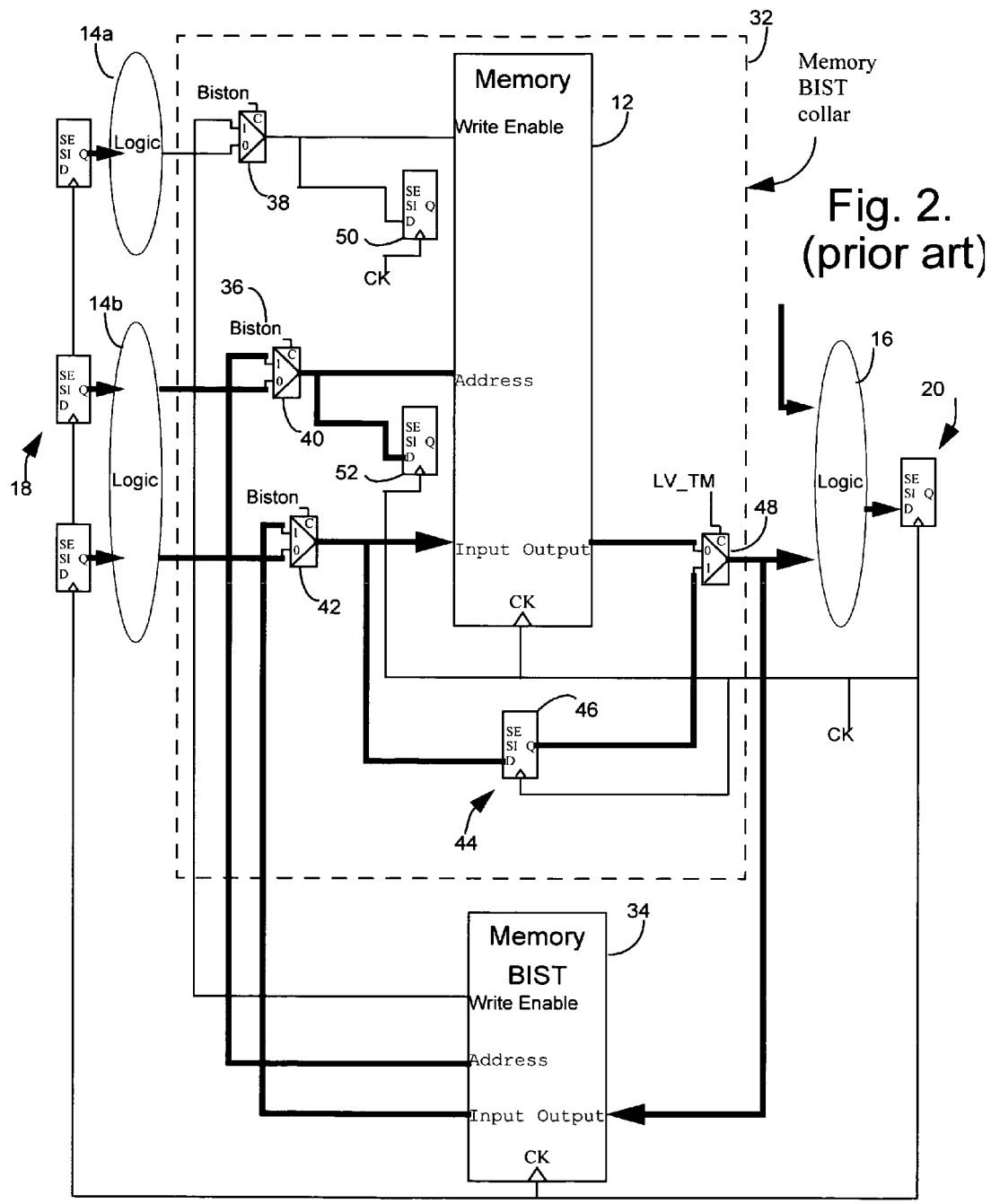
FIG. 2 illustrates a known memory circuit having a test interface or collar, BIST controller and circuitry to allow memory BIST testing of the memory and scan testing of input and output testing of the test interface and surrounding logic.

Bypass flip-flops 46 of FIG. 2 are eliminated. The memory output is connected directly to the data input of the transparent latch 62.

An XOR gate 92 is inserted between one or more memory address input ports and a corresponding test interface address input mux and serves to derive a final address from an initialization address. The XOR gate receives an address mask signal, Adm, and the output of a corresponding test interface address input mux. As previously mentioned, for input and output timing tests, Adm is a square wave to cause data to be written to two memory locations in succession and then read from the same two memory locations in succession.

The write enable input of the memory is connected to the output of a second write enable selector 94 controlled by a test mode signal, tm, which is set high during scan testing and interface timing testing. This selector has a first input connected to a write enable mask, WEM, input and a second input connected to the output of test interface write enable input selector 38. During a timing test, WEM is set high to allow for writing to two memory locations in sequence and then set low to allow for reading from the same two memory locations in sequence.

The output of test interface write enable input selector 38 is also applied to the input of a retiming memory element whose output is applied to an observation scannable memory element 50.

In this embodiment, address test data is launched from a input scannable memory element 18 and a test data input is launched from a corresponding input scannable memory element 18 after the launch of the address data. All flip-flops in the fanin of the memory address input must hold their value for five clock cycles (MCP5) and all flip-flops in the fanin of data inputs must hold their value for four clock cycles (MCP4) for both functional and BIST memory elements. The former keeps the initialization address, A1, constant, throughout the write-thru process. The latter allows for the application of two input data values: initialization data and final data.

In the embodiment illustrated in FIG. 6, the invention described in Applicants' U.S. Pat. No. 6,145,105 issued Nov. 7, 2000 is used to maintain the address stable for five clock cycles and the data stable for four clock cycles before the capture operation so that the circuit only depends on flip-flop outputs which have completed their shift phase and can therefore be modeled as a combinational circuit.

BistOn can be assigned both active and inactive values and the applied value is kept constant during the burst of clock cycles of the capture phase When BistOn is active, the BIST outputs are selected at the test interface mux inputs. When BistOn is inactive, the functional inputs are selected.

This embodiment works best when a local address and data bus are used, i.e., when there is no fanout to other parts of the circuit other than to the memory. Note that an FSM has implicit fanout.

The advantages of this embodiment are that it tests the exact timing of both memory data input and output; eliminates the bypass logic, resulting in significant area savings, eliminates the output mux in the functional path, and has potential application to register files (requires observable address decoder).

The trade-offs of this embodiment are that there is a need to change the functional source of address and data to MCP5 and MCP4 flip-flops, respectively. This implies a) loss of at-speed coverage if a source that fans out to parts of the circuit other than the memory; b) it is not applicable to circuits where the sources of address and/or data is the memory itself; and c) it can introduce redundant faults or asynchronous loops because the path through the memory is modeled as a direct connection from input to output during analysis, at least one address bit has an extra gate (XOR gate) on its functional path to the memory, and the combinational depth of the circuit: the memory is modeled as a direct connection from input to output and the depth of the circuit is the sum of the depth of the logic connected to the data input and the depth of the logic connected to the data output. Fault coverage might be reduced and ATPG complexity increased.

No Functional Circuit Modifications Permitted

FIG. 7 illustrates a test interface embodiment 100 for use when functional circuit modifications are not permitted. Again, the figure shows a circuit with an out-of-phase circuit configuration which includes an inverter 22 applied to the memory clock input and a transparent latch 82 for each memory output, as well as retiming memory elements 84, 86 and 104 and inverters 88 and 90, all of which are not needed for in-phase configuration. In this embodiment, all changes are confined to the memory BIST collar and BIST controller 34. Memory write-thru is enabled only when BistOn is active (Logic 1). Data used for write-thru is sourced by data bypass flip-flops 102 which are MCP4. Address data used for write-thru is sourced by MCP5 flip-flops (not shown) in the memory BIST controller or in the collar if a local address counter is used. The BistOn signal is randomly selected and is an MCP5 source. The write-thru mode is enabled/disabled by a Test Access Port (TAP) instruction register or data register bit (not shown) called Write-Thru Enable, and labeled WTE in FIG. 7, for diagnostic purposes.

As can be seen in FIG. 7, a write enable input selector 94 is provided with inputs connected to the output of a write enable test interface input selector 38 and to write enable mask (WEM) signal. The output of the test controller data input selector 42 is connected to the memory and to the input of bypass scannable flip-flop 102 through a retiming memory element 104. The output of flip-flop 102 is applied to one input of an output selector 48. The output selector 48 is controlled by a AND gate 108. The inputs of the first AND gate are the test mode signal, tm, and the output of a NAND gate 110. The inputs of the NAND gate are BistOn and the aforementioned WTE signal. When tm is inactive (Logic 0), the output of the memory is always selected because the circuit is in functional mode.

The address output of the BIST controller is applied to one input of an XOR gate 112 whose other input is the address mask signal, Adm. The data output of the BIST controller is applied to one input of a selector 114 controlled by the write enable mask, WEM. The other input of the input selector is the output of the bypass flip-flop 102.

When BistOn is active, the functional input logic is not tested. BistOn selects the BIST address/data at the test interface inputs and selects the memory output to test the output logic. A "write-thru" operation is performed. However, when BistOn is inactive, the functional input logic is tested by capturing the functional address and data using the observation and bypass flip-flops respectively. On the output side, the output of the bypass register is selected to test the output logic (both functional and BIST).

The advantages of this embodiment is that no functional changes are required. This has several implications. First, there is no need to reduce at-speed coverage of other destinations. Second, it is applicable to more circuits (e.g. data and/or address provided by another memory). Third, there is no introduction of asynchronous loops or redundant faults. Fourth, it has reduced combinational depth: the memory output is directly controllable from a set of dedicated registers and limit the combinational depth of the circuit as compared to the embodiment of FIG. 6 and there are no combinational paths that traverse the memory. Fifth, there is no need to modify the BIST controller itself except for the address counter in the case illustrated. This requirement can be relaxed by using the address observation flip-flops to provide the address. This is discussed in more detail in the description of the third embodiment below. Sixth, this embodiment allows running with or without write-thru enabled and the signature is the same in both cases. This might be useful for diagnosing problems occurring when the memory is involved in the at-speed scan test.

This embodiment has some trade-offs. The timing of functional inputs is not exactly the same as in functional mode. The difference is primarily from the difference in setup time of the observation and bypass flip-flops compared to the memory input. However, this is usually relatively small. Further, there is a need to employ bypass registers. This is expensive, especially when re-timing is needed for a memory running out-of-phase with the circuit, as in the illustrated embodiment. There is a need for a bypass multiplexer in the functional path at the output of the memory.

Figure 9:
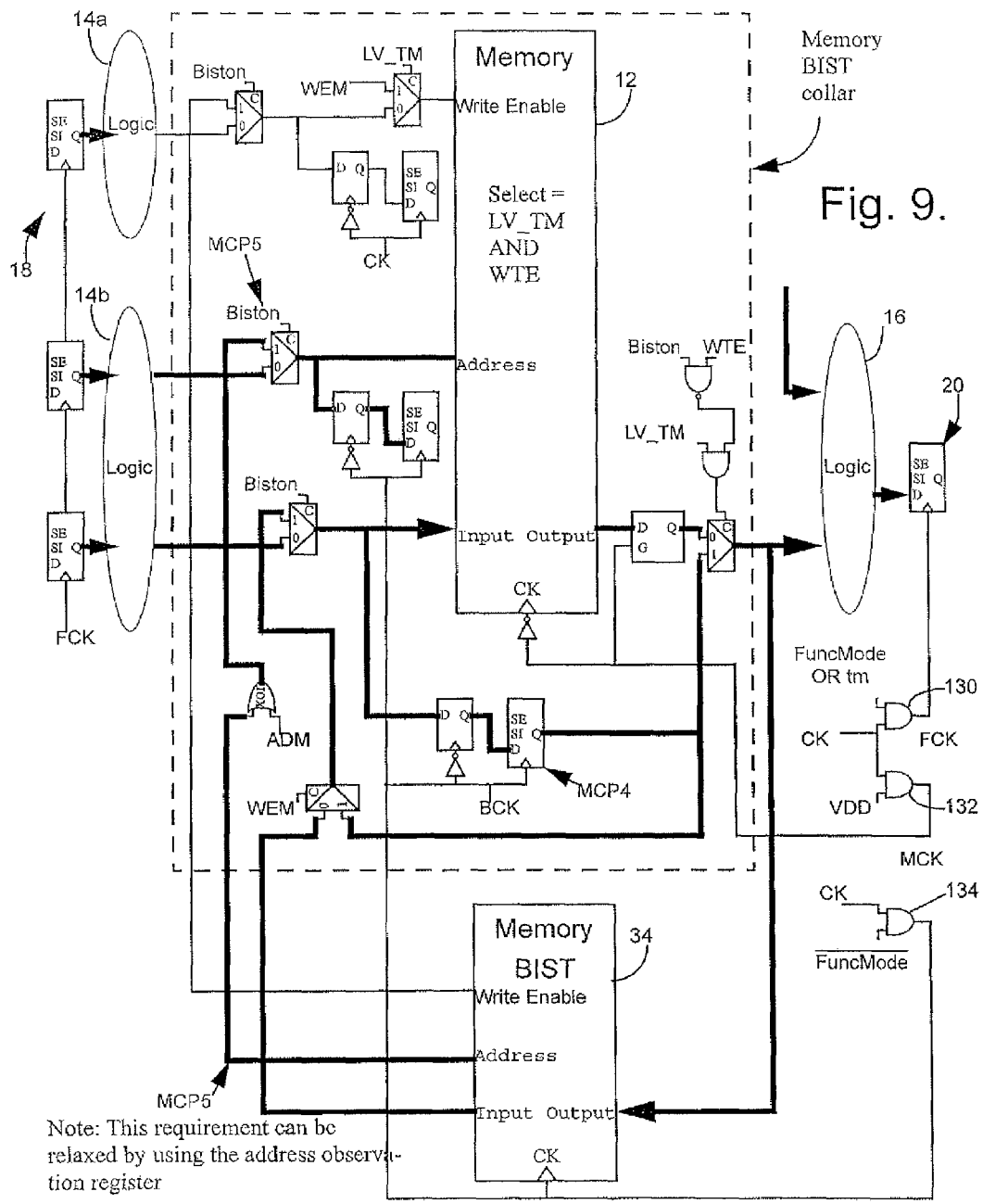
FIG. 9 is circuit diagram of a test interface, similar to that of FIG. 7, according to still another embodiment of the present invention.

FIG. 9 illustrates a modification to the embodiment of FIG. 7. This is described later. This embodiment is useful when the memory BIST circuit must operate from a different clock branch from that of the memory so that the clock can be gated off during functional operation.

No Functional Modification and No Memory Bypass Permitted

In the embodiment illustrated in FIG. 6, the invention described in Applicants' U.S. Pat. No. 6,145,105 issued Nov. 7, 2000 is used to maintain the address stable for five cycles and data stable for four cycles before the capture operation so that the circuit only depends on flip-flop outputs which have completed their shift phase and can therefore be modeled as a combinational circuit. As illustrated in FIG. 8, this requirement can be relaxed in two ways.

First, the requirement to hold the flip-flops which generate the address can be relaxed by using address observation flip-flops 120 to take a snapshot of the memory BIST address at the same time as step 62 (write to the first memory address and launch of the final address) in which the sequence is performed. This step is labeled "Start write to address A1" in FIG. 5. Then, a path 122 is created from the observation flops 120 to the memory address input, via XOR gate 124, selector 126 controlled by scan enable, SE, and test interface selector 40, also controlled by scan enable, to apply the stored address A1 in subsequent step 4 (read of the final address) or the modified address A2 during steps 3 and 5. This could be done, for example, by forcing the value of BistOn high and intercepting the address generated by the memory BIST controller. During the last clock cycle, the observation flip-flops perform a capture, like all other flip-flops, and thereby capture the address applied to the memory. The process of taking the address snapshot and holding the value until the capture step is totally transparent to analysis tools. For that reason, the value of the address at which the snapshot is taken is not important. This feature can be used in the context of all embodiments proposed herein.

Second, the requirement to hold the flip-flops in the BIST controller, which generate the data input, requires analysis tools to calculate the value of the data input before the test pattern is completely shifted into the flip-flops. This data value is used during step 2 (initialization) and step 3 (final) of the sequence. Analysis tools already perform this type of operation when calculating transition fault coverage. Since the memory behaves like a pipeline of depth 3 that is clocked while data is scanned in, the initialization and final values are simply derived from a shifted version of the scan chain contents. This operation only needs to be performed locally on the portion of the circuit which generates the data input of the memory.

This embodiment has all of the advantages of the first embodiment described earlier and eliminates the data input-output bypass logic, thereby saving area and eliminating a multiplexer on memory output functional paths. There is no need to modify the memory BIST controller. There is no need to modify the functional logic and there is no impact on at-speed fault coverage of flip-flops that fan out to logic other than memory.

The trade-offs of this embodiment are that first, as in the first embodiment, there are some cases in which the method is not applicable; second, the embodiment is not applicable to circuits where the source of address and/or data is a memory itself; third, the embodiment can introduce redundant faults or even loops because the path through the memory goes through pipeline stages whose value cannot be set independently; and fourth, the combinational depth is the same as in the first embodiment.

Special Cases

Memories with incomplete address ranges can be handled by forcing the most significant bit (MSB) of the address to 0 so that no access is performed out of range. This results in a slight loss of coverage if the MSB is on a critical path.

For multi-port memories, the principle is the same for all cases. The BIST logic must be on the same clock domain as the read port that is to be tested at-speed. Multiple read ports can be tested if they share the same clock. The timing at the input used during the write operation is tested at-speed if the clock is the same as the read port. Otherwise, MCP5+ (false path) source flip-flops must be used. Another possibility to cover the address path on the write port(s) is to separate the clock for the observation logic with which it is associated:

a) 1R1W ports: Force read address to be the same as the write address. The BIST logic must be on the same clock domain as the read port. The source of the signals used to perform the write operation must be MCP5+ (false path) as opposed to an MCP4 if a different clock is used for the write port.

b) 2RW ports: If the clocks are the same, force MSBs (one if complete address space and two if incomplete address space) to opposite values. The value can be constant or derived from the same bit that is inverted before being applied to the second port. Local bypass logic is used. If the clocks are different for the two ports, only one RW port can be tested using write-thru. Test the one working at the highest speed and put the BIST logic on that domain.

c) 1W2R ports: If the clocks are the same, the solution is similar to a), i.e., force address to be the same on both read ports and write port. This test will stress the memory cell because both read ports will be active. If the clocks are different for the three ports, only one of the read ports can be tested at-speed. The second read port can still perform "shadow" reads to disturb the first port being tested at-speed.

d) 2W1R ports: If the clocks are different, turn off the writes on one of the write-only ports and the solution is similar to 1R1W (see a).

e) 1RW1W ports: If the clocks are different, turn off writes on the write-only port and use the 1RW solution.

f) 1RW1R ports: If the clocks are different, always select the bypass register to drive the read-only port. If the clocks are the same, the solution is similar to 1R1W (see a).

Low Power Option

It is sometimes desirable to provide modes where either the functional logic or memory BIST logic needs to cease all operations to reduce power consumption or reduce the number of simulation events. To do so, gates can be added to create balanced branches of the clock distribution tree so that synchronous operation between branches is preserved. FIG. 9 illustrates the embodiment of FIG. 8 which provides AND gates 130, 132 and 134 for providing these modes and for enabling balanced branches and disabling others under different conditions.

AND gate 130 receives a functional signal, FuncMode input, or test mode signal, tm at one input and a clock signal, CK, at its other input and outputs a functional clock signal, FCK, branch. AND gate 132 receives clock signal, CK, at one input and $V_{DD}$ at its other input to produce a memory clock signal branch, MCK. AND gate 134 is connected to clock input, CK, and an inverted functional mode input to generate a BIST clock signal branch.

Although the present invention has been described in detail with regard to preferred embodiments and drawings of the invention, it will be apparent to those skilled in the art that various adaptions, modifications and alterations may be accomplished without departing from the spirit and scope of the present invention. Accordingly, it is to be understood that the accompanying drawings as set forth hereinabove are not intended to limit the breadth of the present invention, which should be inferred only from the following claims and their appropriately construed legal equivalents.

We claim:

1. A method of testing a memory interface associated with an embedded memory in a semiconductor circuit, said method comprising:

launching an initialization address and initialization data;

writing said initialization data to a memory location corresponding to said initialization address and launching final data;

writing said final data to a memory location corresponding to a final address derived from said initialization address;

reading initialization data from said memory location corresponding to said initialization address;

reading said final data from said memory location corresponding to said final address;

capturing output data from said memory interface corresponding to the act of reading from the memory location corresponding to said final address; and analyzing said captured output data to determine whether said captured output data corresponds to expected data.

2. The method as defined in claim 1, further including:

scanning address and input data into scannable memory elements in a fan-in of respective memory address and memory data inputs prior to said acts of writing said initialization data and writing said final data; and scanning out the contents of said scannable memory elements in a fan-out of the memory subsequent to said act of capturing but prior to said act of analyzing.

3. The method as defined in claim 2, said act of scanning address and input data comprising scanning in a first memory address and first memory input data into said scannable memory elements in the fan-in of the memory address and memory data inputs.

4. The method as defined in claim 3, wherein the contents of said memory locations are determined by the state of said scannable memory elements.

5. The method as defined in claim 4, further including performing reading of said memory locations corresponding to said final address and wherein the act of capturing output data is at a rated speed of said memory.

6. The method as defined in claim 4, said act of deriving a second memory address comprising flipping at least one bit of said memory location corresponding to said initialization address.

7. The method as defined in claim 2, further including holding constant contents of said scannable memory elements in the fan-in of memory address inputs during writing and reading of said memory and holding constant the contents of said scannable memory elements in the fan-in of memory data inputs after writing to said memory locations corresponding to said initialization address.

8. The method as defined in claim 7, further including modeling said memory as a direct connection between said memory data inputs and a memory data output.

9. The method as defined in claim 1, further including holding the initialization address in a dedicated address register.

10. The method as defined in claim 9, further including modeling said memory as a number of non-scannable memory elements connected between a memory data input and a corresponding memory data output of the memory with the number of memory elements corresponding to a number of clock cycles to propagate data through the memory.

11. The method as defined in claim 1, further including performing said method using a scan test which includes a capture phase having a sequence of clock cycles between test data scan in and test response scan out operations with at least a last two of the cycles of said sequence being at said rated speed of said memory and with a penultimate cycle being a read cycle of said second memory location and a last cycle being a capture cycle.

12. A method for performing an at-speed scan test of a memory interface associated with an embedded memory in a semiconductor circuit, said memory having memory data inputs controllable from and memory data outputs observable by scannable memory elements, said method comprising:
- scanning an initialization address and an initialization data word into respective scannable memory elements in a fan-in of respective memory address and of the memory data inputs of the memory;
- launching said initialization address and initialization data word from said scannable memory elements in the fan-in of the memory address and memory data inputs;
- writing said initialization data word to said initialization address and launching a final data word;
- deriving a final address from said initialization address;
- writing said final data word to said final address;
- reading said initialization address;
- reading said final address; and
- capturing said memory data outputs in output scan chains.

13. The method as defined in claim 12, wherein said act of deriving a final address from said initialization address comprises flipping at least one bit of said initialization address.

14. The method as defined in claim 12, further including performing said writing and reading operations while maintaining said initialization address stable for a first predetermined number of clock cycles prior to a capture cycle and maintaining said final data source address stable for a second predetermined number of clock cycles prior to a capture cycle.

15. A method for performing an at-speed scan test of a memory interface associated with an embedded memory in a semiconductor circuit, said memory having memory data inputs controllable from and memory data outputs observable by scannable memory elements, said method comprising:
- storing a test address in a register consisting of at least one storage elements and applying an output of said register to an input of a corresponding test interface address input selector;
- alternating an output of said at least one storage element to produce initialization and final addresses;
- scanning said initialization address and an initialization data word into respective scannable memory elements in a fan-in of respective memory address and of the memory data inputs of the memory;
- launching said initialization address and initialization data word from said scannable memory elements in the fan-in of the memory address and memory data inputs;
- writing said initialization data word to said initialization address and launching a final data word;
- writing said final data word to said final address;
- reading said initialization address;
- reading said final address; and
- capturing said memory data outputs in output scan chains.

16. The method as defined in claim 15, said act of alternating including:
- flipping the output of each of the at least one storage elements prior to applying it to a corresponding memory address inputs.

17. The method as defined in claim 15, further including, for a memory having an incomplete address ranges, forcing a most significant bit (MSB) of each address to Logic 0 so that no access is performed out of range.

18. A semiconductor circuit having an embedded memory having a write enable input, memory address inputs, memory data inputs and memory data outputs, and interface logic to be tested, said circuit comprising:
- an address register in a fan-in to said memory address inputs for receiving and holding initialization address data corresponding to a first of said memory locations for a first predetermined number of clock cycles prior to a capture cycle;
- means for deriving, from said initialization address data, final memory address data corresponding to a second of said memory locations;
- a data register for storing an initialization data input for a second predetermined number of clock cycles prior to a capture cycle;
- means for writing to said initialization address and said final address in succession and for reading said initialization address and said final address in succession in the same order in which said initialization address and said final address were written under control of a clock signal; and
- means for capturing output data in the fan-out of said memory data outputs.

19. The circuit as defined in claim 18, wherein said address register comprises all memory elements in the fan-in to said memory address inputs and said data register comprises all memory elements in the fan-in to said memory data inputs.

20. The circuit as defined in claim 18, wherein said address register comprises all memory elements in the fan-in to said memory address inputs selected by a first value of a control signal and said data register comprises all memory elements in the fan-in to said memory inputs selected by the first value of the control signal.

21. The circuit as defined in claim 18, wherein said address register comprises all memory elements of a dedicated address register and said data register comprises all memory elements in the fan-in to said memory inputs.

22. The circuit as defined in claim 18, said means for writing including means connected to said memory write enable input for receiving a write enable mask and a functional input and responsive to a test control signal for selecting one of said write enable mask and said functional inputs and applying the selected input to said memory write enable input.

23. The circuit as defined in claim 22, said means for capturing including an output scan chain having scannable memory elements in the fan-out of said memory data outputs.

24. The circuit as defined in claim 18, said address and data registers including scannable memory elements in an input scan chain for receiving write enable input data, said initialization address data and final input data.

25. The circuit as defined in claim 24, further including scannable memory elements in an output scan chain in the fan-out of memory outputs for capturing data output from said interface logic.

26. The circuit as defined in claim 18, further including a scannable memory bypass register with an output selectively connected to said memory data inputs for writing to said two memory locations under control of a first value of a control signal and for substituting the contents of said bypass register for memory output under control of a second value of said control signal.

27. The circuit as defined in claim 18, further including an address input observation register having an input for receiving address input data applied to said memory and an output selectively connected to said memory address inputs.

* * * * *